(12) United States Patent
Tang

(10) Patent No.: US 9,148,947 B2
(45) Date of Patent: Sep. 29, 2015

(54) STACKED ELECTROMAGNETIC BANDGAP STRUCTURE

(71) Applicant: ShenZhen Treasure City Technology Co., LTD., ShenZhen (CN)

(72) Inventor: Shao-You Tang, New Taipei (TW)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 213 days.

(21) Appl. No.: 13/971,859

(22) Filed: Aug. 21, 2013

(65) Prior Publication Data

US 2014/0291007 A1   Oct. 2, 2014

(30) Foreign Application Priority Data

Mar. 29, 2013   (TW) .............................. 102111336 A

(51) Int. Cl.
*H05K 1/02*   (2006.01)

(52) U.S. Cl.
CPC ............ *H05K 1/0218* (2013.01); *H05K 1/0224* (2013.01); *H05K 1/0236* (2013.01); *H05K 1/0298* (2013.01)

(58) Field of Classification Search
CPC . H05K 1/0216; H05K 1/0218; H05K 1/0219; H05K 1/0221; H05K 1/0222; H05K 1/0224; H05K 1/0225; H05K 1/0228
See application file for complete search history.

(56) References Cited

U.S. PATENT DOCUMENTS 8,595,924 B2 * 12/2013 McKinzie, III .................. 29/846
2013/0003333 A1 * 1/2013 Toyao et al. .................. 361/777

* cited by examiner

*Primary Examiner* — Jeremy C Norris
(74) *Attorney, Agent, or Firm* — Novak Druce Connolly Bove + Quigg LLP

(57) ABSTRACT

An EBG (electromagnetic bandgap) device with a stacked structure includes a first ground plane, a first power plane, a via, a second power plane, a second ground plane; a third power plane, and several ground vias. The first ground plane, the second power plane, and the second ground plane are connected through the several ground vias. The ground vias and the second power plane do not have actually electrical connection. The first ground plane, the first power plane, the second power plane, and the via form a first EBG structure and the first ground plane, the second ground plane, the third power plane and the several ground vias form a second EBG structure.

3 Claims, 3 Drawing Sheets

STACKED ELECTROMAGNETIC BANDGAP STRUCTURE

BACKGROUND

1. Technical Field

The present disclosure relates to electromagnetic bandgap (EBG) structures, and particularly to a stacked EBG structure with more and wider stopbands.

2. Description of Related Art

The EBG structure 1 of related art, such as that shown in FIG. 1, includes a ground plane 10, a power plane 30, and an EBG layer 20. The power plane 30 and the ground plane 10 are arranged parallel to each other, and the EBG layer 20 is between the power plane 30 and the ground plane 10. The EBG layer 20 is connected to either the power plane 30 or the ground plane 10 through vias 40. In the case of the structure of FIG. 1, the EBG layer 20 is connected to the power plane 30.

The via 40 has a self-inductance. The ground plane 10 and the EBG layer 20 have a predetermined capacitance. A stopband center frequency of the EBG structure 1 changes depending on the self-inductance and the capacitance. However, the EBG structure 1 of related art can supply only stopbands in a limited number and with limited operating frequencies.

Therefore, it is desirable to provide a stacked EBG structure with more and wider stopbands.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will be described with reference to the drawings.

Figure 1:
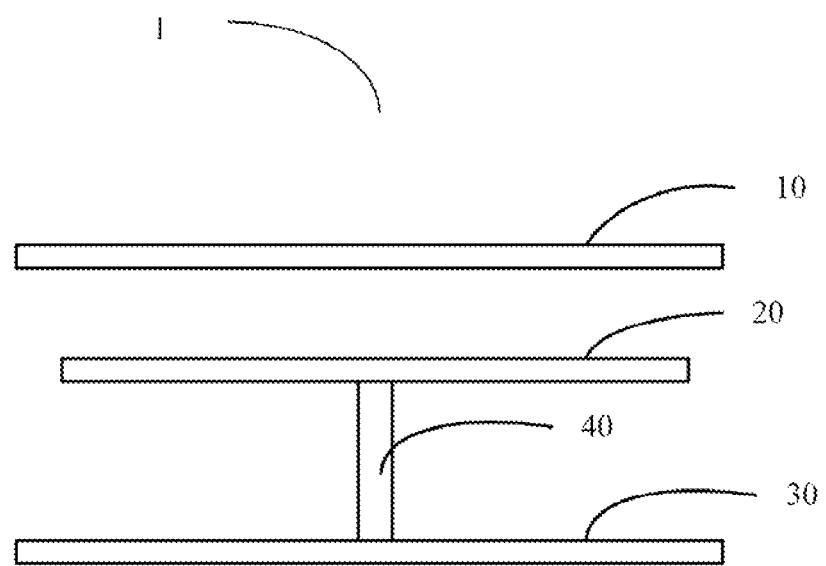
FIG. 1 is a cross-sectional view of an EBG structure of related art.
Figure 2:
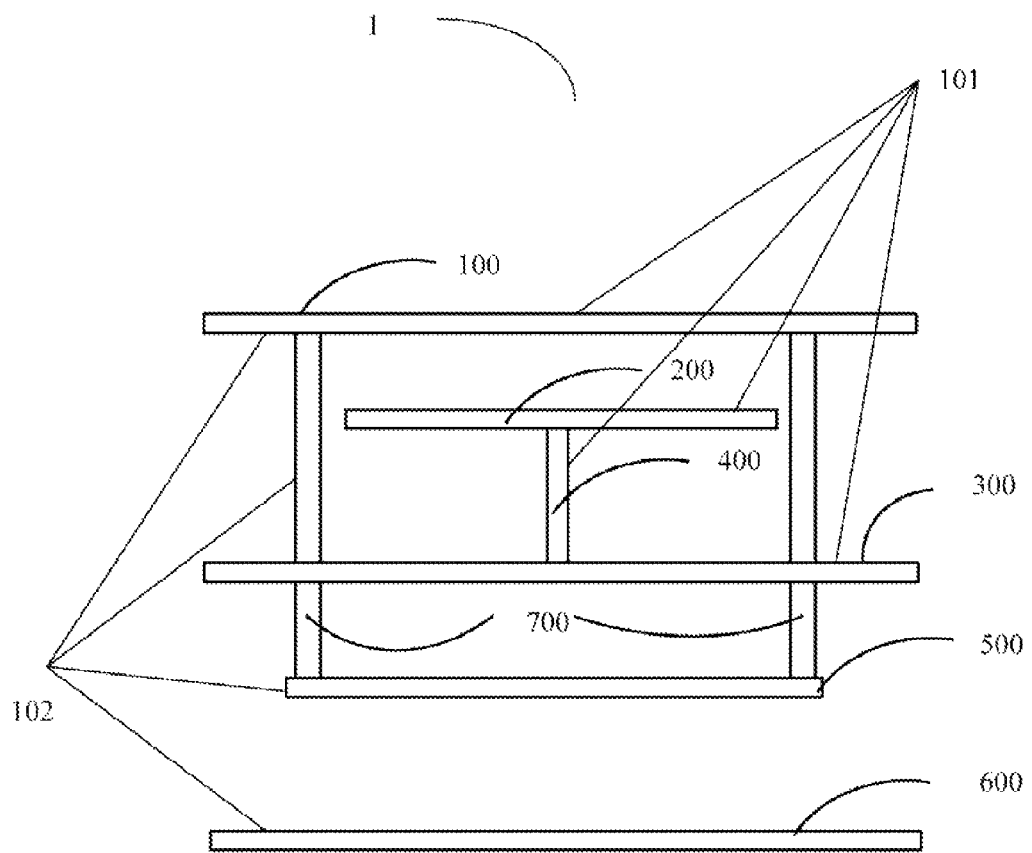
FIG. 2 is a cross-sectional view of a stacked EBG structure according to an embodiment.

FIG. 2 is a cross-sectional view of a stacked EBG structure. The stacked EBG structure 1' includes a first ground plane 100, a first power plane 200, a second power plane 300, a via 400, a second ground plane 500, a third power plane 600, and a number of ground vias 700. The first power plane 200 and the second power plane 300 are connected through the via 400. The first ground plane 100, the second power plane 300 and the second ground plane are connected through the ground vias 700. The ground vias 700 and the second power plane 300 do not have actually electrical connection.

The first ground plane 100, the first power plane 200, the second power plane 300, and the via 400 form a first EBG structure 101. The first ground plane 100, the second ground plane 500, the third power plane 600 and the ground vias 700 form a second EBG structure 102. The first EBG structure 101 and the second EBG structure 102 have different stopband bandwidths. Furthermore, the ground vias 700 have guard ring characteristics, thus achieving an increase in stopband bandwidth in the stacked EBG structure 1'.

Figure 3:
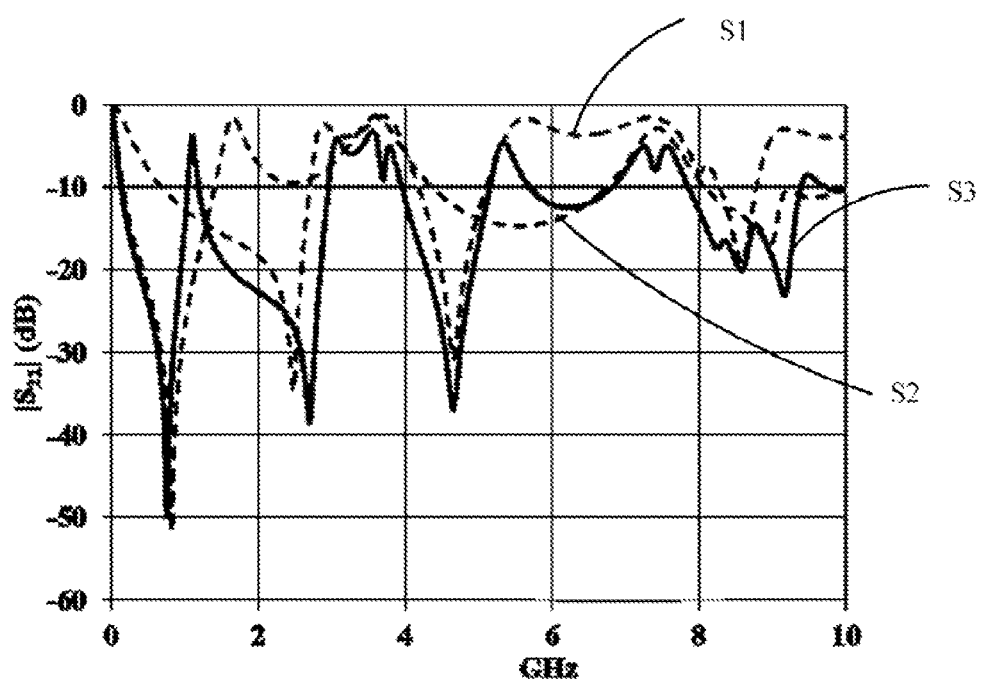
FIG. 3 is a graph illustrating results when a power noise coupling coefficient is measured in frequency domain in case when the stacked EBG structure of FIG. 2 is employed, compared to when only a first EBG structure being employed and when only a second EBG structure is employed.

FIG. 3 is a graph illustrating results when a power noise coupling coefficient is measured in frequency domain in case when the first EBG structure 101 and the second EBG structure 102 is employed respectively.

A vertical axis represents a power noise coupling coefficient S21 and a horizontal axis represents a frequency. A dotted line S1 represents results when a power noise coupling coefficient S21 is measured in frequency domain when the first EBG structure 101 is employed. A dotted line S2 represents results when a power noise coupling coefficient S21 is measured in frequency domain when the second EBG structure 102 is employed. A full line S3 represents results when a power noise coupling coefficient S21 is measured in frequency domain when the stacked EBG structure 1' is employed.

The full line S3 shows that the stacked EBG structure 1' provides stopbands having a wider frequency band compared with the first structure 101 and the second structure 102.

It will be understood that the above particular embodiments are shown and described by way of illustration only. The principles and the features of the present disclosure may be employed in various and numerous embodiments thereof without departing from the scope of the disclosure. The above-described embodiments illustrate the possible scope of the disclosure but do not restrict the scope of the disclosure.

What is claimed is:

1. A stacked EBG (electromagnetic bandgap) structure comprising:
    a first ground plane;
    a first power plane;
    a via;
    a second power plane, connected with the first power plane via the via;
    a second ground plane;
    a third power plane, and
    a plurality of ground vias, wherein the first ground plane, the second power plane and the second ground plane are connected through the ground vias, the ground vias and the second power plane do not have actually electrical connection, the first ground plane, the first power plane, the second power plane, and the via forms a first EBG structure, the first ground plane, the second ground plane, the third power plane and the ground vias forms a second EBG structure.

2. The stacked EBG structure of claim 1, wherein the first EBG structure and the second EBG structure have different stopband bandwidths, the ground vias has characteristic of guard ring, thereby the stacked EBG structure achieves an increase in stopband bandwidths.

3. The stacked EBG structure of claim 2, wherein a frequency band of a stopband provided by the stacked EBG structure is wider than with a frequency band of a stopband provided by the first EBG structure and the second EBG structure respectively.

* * * * *